United States Patent
Chobanyan et al.

(10) Patent No.: US 11,042,683 B2
(45) Date of Patent: Jun. 22, 2021

(54) VOID AVOIDANCE VERIFICATIONS FOR ELECTRONIC CIRCUIT DESIGNS

(71) Applicant: Hewlett Packard Enterprise Development LP, Houston, TX (US)

(72) Inventors: Elene Chobanyan, Ft. Collins, CO (US); Karl J. Bois, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 631 days.

(21) Appl. No.: 15/217,226

(22) Filed: Jul. 22, 2016

(65) Prior Publication Data

US 2018/0025106 A1 Jan. 25, 2018

(51) Int. Cl.
*G06F 30/398* (2020.01)

(52) U.S. Cl.
CPC .................. *G06F 30/398* (2020.01)

(58) Field of Classification Search
CPC ............ G06F 17/5081; G06F 17/5068; G06F 17/5077; G06F 17/5072; G06F 2217/12; G06F 17/5045; G06F 17/505; G06F 2217/06; G06F 2217/08; G06F 17/50; G06F 17/5004; G03F 1/36; G03F 7/70475; G03F 1/84
USPC .......... 716/106, 111, 118–119, 126.132, 139
See application file for complete search history.

(56) References Cited

U.S. PATENT DOCUMENTS

| | | | |
|---|---|---|---|
| 6,883,149 B2 | 4/2005 | Li et al. | |
| 6,976,233 B1 * | 12/2005 | Frank | G06F 17/5018 716/112 |
| 7,571,405 B1 | 8/2009 | Aik | |
| 8,595,667 B1 | 11/2013 | Shroff et al. | |
| 9,201,296 B2 * | 12/2015 | Kageyama | G03F 1/84 |
| 2004/0150970 A1 | 8/2004 | Lee | |
| 2009/0049419 A1 | 2/2009 | Kato | |
| 2013/0175077 A1 | 7/2013 | Kim | |

* cited by examiner

*Primary Examiner* — Nghia M Doan
(74) *Attorney, Agent, or Firm* — Hewlett Packard Enterprise Patent Department (57) ABSTRACT

A system may include an input engine and a void avoidance engine. The input engine may access an electronic circuit design of an electronic design automation (EDA) tool as well as identify a first net and a second net in the electronic circuit design. The void avoidance engine may perform a void avoidance verification scan to determine whether the first net, the second net, or both, are within a threshold distance from any voids in the electronic circuit design. The void avoidance engine may also generate a double violation alert responsive to a determination that the first net and the second net are both within the threshold distance from a particular void in the electronic circuit design and that the first net and the second net are located on different sides of the same plane of the electronic circuit design.

20 Claims, 6 Drawing Sheets

VOID AVOIDANCE VERIFICATIONS FOR ELECTRONIC CIRCUIT DESIGNS

BACKGROUND

With rapid advances in technology, computing systems are increasingly prevalent in society today. Vast computing systems execute and support applications that communicate and process immense amounts of data, many times with performance constraints to meet the increasing demands of users. Computing systems include hardware, for example as circuitry implemented through printed circuit boards and integrated circuits. Design of such hardware may include the use of electronic design automation tools.

BRIEF DESCRIPTION OF THE DRAWINGS

Certain examples are described in the following detailed description and in reference to the drawings.

DETAILED DESCRIPTION

The discussion below refers to electronic circuit designs. An electronic circuit design may refer to any electronic representation of an electronic circuit. Electronic design automation (EDA) tools may create, modify, and export electronic circuit designs, which may support the design of physical circuits in a virtual representation prior to actual physical manufacture. Electronic circuit designs may thus include elements of physical electronic circuits, including nets and voids. A net may refer to a connectivity element of the electronic circuit, for example as a conductor or trace that interconnects two or more component terminals of an integrated circuit or a printed circuit board (PCB). EDA tools may support the ability to design printed circuit boards and other electronic circuits that include layouts with multiple different conductive planes, such as ground/power planes. A void may refer to a cutout in an electronic circuit design plane that is not conductive, e.g., filled with a dielectric or air depending on its nature. Voids may be implemented as antipads, back-drilled holes, board mechanical mounts, thermal releases, etc.

Examples consistent with the present disclosure may support void avoidance verification for nets in an electronic circuit design. The features described herein may support detection of nets in an electronic circuit design located within a threshold distance from voids in the electronic circuit design, which may cause decreased performance, malfunctioning, or failure of electronic circuits. In that regard, the void avoidance verification features described herein may provide verifications at the design stage that result in increased circuit reliability, which may further result in an overall improvement in the functioning of computing systems. The features described herein may also provide for the detection of critical design flaws in the form of double violations, which include specific scenarios where multiple nets located on different sides of the same conductive plane of a PCB (or other electronic circuit) are within a threshold distance from the same void. Detection of such design flaws prior to fabrication may result in the production of electronic circuits less likely to malfunction or fail.

Figure 1:
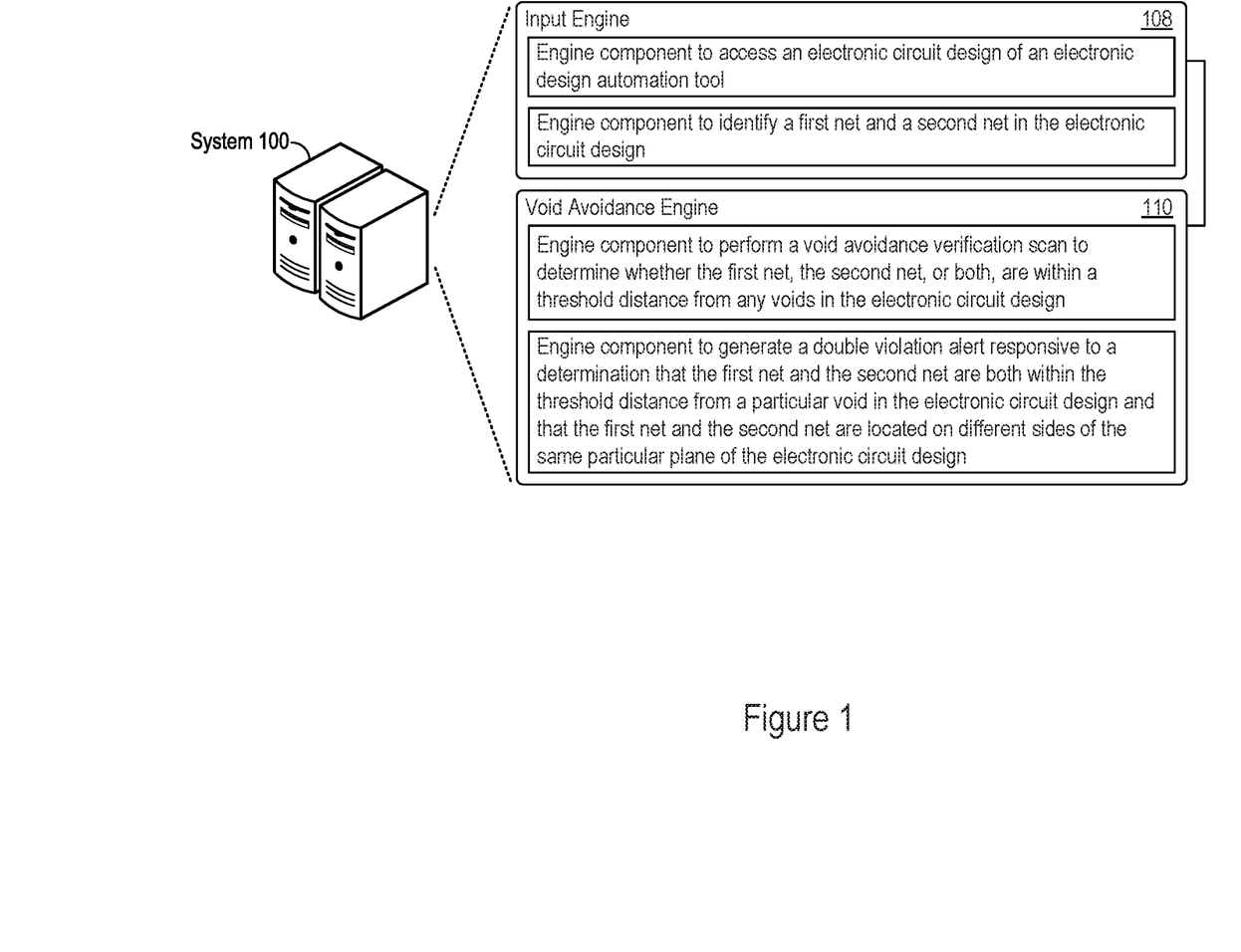
FIG. 1 shows an example of a system that supports void avoidance verifications for an electronic circuit design.

FIG. 1 shows an example of a system 100 that supports void avoidance verifications for an electronic circuit design. The system 100 may take the form of any computing system, and may include a single or multiple computing devices such as servers, compute nodes, desktop or laptop computers, smart phones or other mobile devices, tablet devices, embedded controllers, and more. The system 100 may support execution of various EDA tools to design electronic circuits.

As described in greater detail herein, the system 100 may support void avoidance verifications for nets in an electronic circuit design. In doing so, the system 100 may determine whether a particular net in the electronic circuit design satisfies threshold void distance criteria applicable to the particular net. A particular net may be referred to as a violating net when the particular net does not satisfy the threshold void distance criteria. For example, the system 100 may determine whether a particular net is located within a threshold distance from any voids in the electronic circuit design. In particular, the system 100 may determine whether net segments (e.g., not directly linked to an interconnection via of the net) are located within the threshold distance from voids of the electronic circuit design. If so, the system 100 may identify the particular net as a violating net positioned within a threshold distance (e.g., particularly applicable to the particular net) from one or more voids in the electronic circuit design. As also described herein, the system 100 may further generate double violation alerts for multiple violating nets identified as (i) in violation to respective threshold void distance criteria with respect to the same particular void and (ii) positioned on different sides of the same plane of the electronic circuit design, such as a ground/power plane or a conductive plane of the electronic circuit design.

The system 100 may implement various engines to provide or support any of the void avoidance verification features described herein. In the example shown in FIG. 1, the system 100 implements an input engine 108 and a void avoidance engine 110. Many of the void avoidance verification features disclosed herein are described with respect to the input engine 108 and the void avoidance engine 110, though various other forms and implementations are possible.

The system 100 may implement the engines 108 and 110 (including components thereof) in various ways, for example as hardware and programming. The programming for the engines 108 and 110 may take the form of processor-executable instructions stored on a non-transitory machine-readable storage medium, and the processor-executable instructions may, upon execution, cause hardware to perform any of the features described herein. In that regard, various programming instructions of the engines 108 and 110 may implement engine components to support or provide the features described herein.

The hardware for the engines 108 and 110 may include a processing resource to execute programming instructions. A processing resource may include various number of processors with a single or multiple processing cores, and a processing resource may be implemented through a single-processor or multi-processor architecture. In some examples, the system 100 implements multiple engines using the same system features or hardware components (e.g., a common processing resource).

The input engine 108 and the void avoidance engine 110 may include components to implement any combination of the features discussed herein. As shown in the example implementation of FIG. 1, the input engine 108 may include engine components to access an electronic circuit design of an electronic design automation tool and to identify a first net and a second net in the electronic circuit design. As also shown in the example implementation of FIG. 1, the void avoidance engine 110 may include engine components to perform a void avoidance verification scan to determine whether the first net, the second net, or both, are within a threshold distance from any voids in the electronic circuit design as well as to generate a double violation alert responsive to a determination that the first net and the second net are both within the threshold distance from a particular void in the electronic circuit design and that the first net and the second net are located on different sides of the same particular plane of the electronic circuit design.

These and other aspects of the void avoidance verification features disclosed herein are described in greater detail next.

Figure 2:
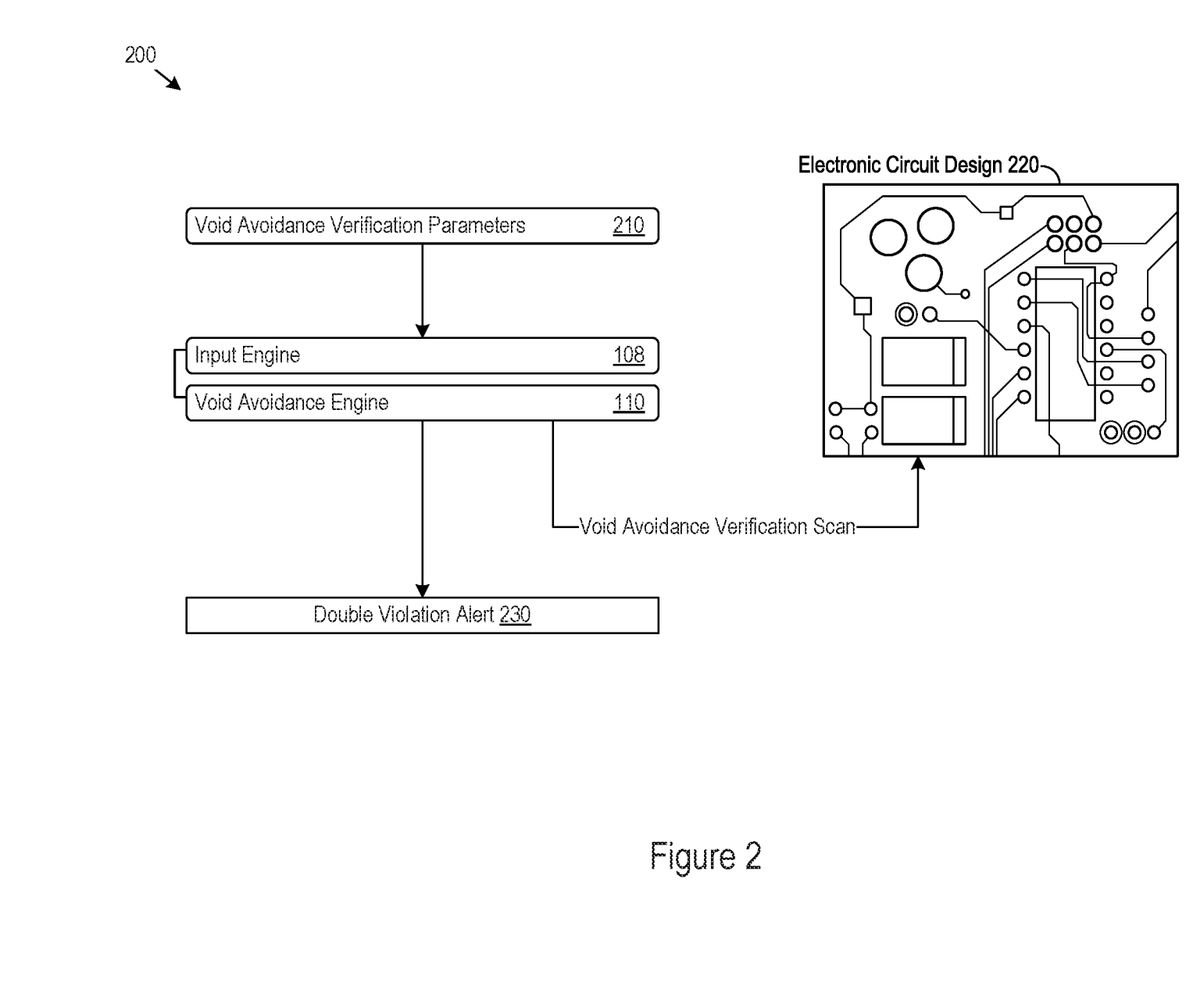
FIG. 2 shows an example of an architecture that supports generation of double violation alerts as part of a void avoidance verification for an electronic circuit design.

FIG. 2 shows an example of an architecture 200 that supports generation of double violation alerts as part of a void avoidance verification for an electronic circuit design. The example architecture 200 shown in FIG. 2 includes an input engine 108 and a void avoidance engine 110, which a computing system may implement. The input engine 108 and void avoidance engine 110 may function separate from, in combination with, or as part of an EDA tool. In some examples, the programming of the input engine 108 and the void avoidance engine 110 may include script instructions supported by the EDA tool, and the EDA tool may support, trigger, or provide the void avoidance verification features implemented by the input engine 108 and the void avoidance engine 110.

In operation, the input engine 108 and void avoidance engine 110 may verify that nets within an electronic circuit design satisfy threshold void distance criteria. In doing so, the input engine 108 may access the void avoidance verification parameters 210 applicable to a particular electronic circuit design, such as the electronic circuit design 220 shown in FIG. 2. The void avoidance verification parameters 210 may include various parameters applicable to a void avoidance verification. Through the void avoidance verification parameters 210, the input engine 108 may determine which particular nets of an electronic circuit design to perform the void avoidance verification for, the specific threshold void distance criteria applicable to the particular nets, the specific voids of the electronic circuit design 220 applicable to the void avoidance verification, and the like. In some examples, the void avoidance verification parameters 210 are specified through a user-provided input file, as user inputs provided through a user interface (e.g., command line or script-prompted interface), as code parameters, or in various other ways.

As an example parameter, the void avoidance verification parameters 210 may specify a list of nets upon which to perform a void avoidance verification. The void avoidance verification parameters 210 may include net names or net keywords, through which the input engine 108 may identify particular nets of the electronic circuit design 220. Through the void avoidance verification parameters 210, the input engine 108 may identify a selected subset of the nets of the electronic circuit design 220 for a void avoidance verification, such as a list of high-speed or performance-sensitive nets of the electronic circuit design 220.

As another example parameter, the void avoidance verification parameters 210 may specify threshold distances applicable to each of the specified nets. The input engine 108 may identify a respective threshold distance applicable to nets in the electronic circuit design 220, for instance through a specified global threshold distance applicable to each net in the electronic circuit design 220, through a specific threshold distance assigned to an individual net or specific group of nets, or as a combination of both. In some implementations, the void avoidance verification parameters 210 may specify a default threshold distance applicable for the nets in the electronic circuit design 220 as well as individual or group threshold distances applicable to specific nets of the electronic circuit design 220 (and which may thus override the default threshold distance). The void avoidance verification parameters 210 may thus flexibly provide for customized or differentiated application of threshold distances for different nets of the electronic circuit design 220.

In some examples, the void avoidance verification parameters 210 may identify specific voids in the electronic circuit design 220. Such an identification may occur through listing of specific void names, void types, or void-identifying keywords. The input engine 108 may identify the listed voids as the specific voids considered in the void avoidance verification. Other non-listed voids present in the electronic circuit design 220 but not specified in the void avoidance verification parameters 210 may be ignored in the void avoidance verification. When no voids are explicitly specified in the void avoidance verification parameters 210, the input engine 108 may determine that each void in the electronic circuit design 220 should be considered in the void avoidance verification.

As noted above, the void avoidance verification parameters 210 may be set forth, in part or in whole, through an input file. In such examples, the input engine 108 may identify nets for void avoidance verification based on net names, net keywords, or both, specified in a user-provided input file. As another example, the input engine 108 may identify threshold distances applicable to various nets of the electronic circuit design 220 from the user-provided input file. In other implementations, a user may configure any number of void avoidance verification parameters 210 through a command line or script interface, through a graphical user interface, through interfaces provided by an EDA tool itself, or in other ways.

Turning to the void avoidance verification, the void avoidance engine 110 may perform the void avoidance verification for the electronic circuit design 220 according to the parameters specified in the void avoidance verification parameters 210. A void avoidance verification may apply threshold void distance criteria that are satisfied when nets are sufficiently distant from voids in the electronic circuit design 220. To perform the verification, the void avoidance engine 110 may parse through the electronic circuit design 220 and analyze the location and pathing of various nets to determine whether any portion (e.g., segment) of the nets violate the threshold void distance criteria. That is, the void avoidance engine 110 may determine whether a particular net is located within a threshold distance from a void in the electronic circuit design 220. If so, the void avoidance engine 110 may identify such a net as a violating net that does not satisfy the threshold void distance criteria.

In some examples, the void avoidance engine 110 executes a void avoidance verification scan on the electronic circuit design 220 that verifies whether nets in the electronic circuit design 220 are positioned at a requisite threshold distance from voids in the electronic circuit design 220. The void avoidance verification scan applied by the void avoidance engine 110 may take the form of a subroutine or application task implemented by an EDA tool. For multiple nets specified in the void avoidance verification parameters 210, the void avoidance engine 110 may automatically and seamlessly trigger the scans for each of the specified nets, which may provide an elegant and efficient mechanism to trigger such scans. When the void avoidance verification parameters 210 specify specific threshold distances that individually differ among the specified nets, the void avoidance engine 110 may flexibly configure the void avoidance verification scans according to the specific threshold distances. Doing so may provide increased flexibility in how different nets or net types are analyzed with respect to void distancing.

In some examples, the void avoidance verification scans may exclude, from the verification, net segments directly linked to layer-interconnect vias for the net. This may be the case as nets in an electronic circuit design may specifically utilize some voids of the electronic circuit design as via interconnects, by which the net may traverse across different layers and planes of the electronic circuit design. In this case, net proximity to these voids is intentional. Instead, the void avoidance verification engine 110 may check for net segments located within a threshold distance of other voids not intended for specific use by a particular net. These specific considerations may be included in the threshold void distance criteria, for example.

From the void avoidance verification scans, the void avoidance engine 110 may determine which of the identified nets fail the void avoidance verification. That is, the void avoidance engine 110 may identify any particulars net(s) of the electronic circuit design 220 that are positioned, at least in part, within a threshold distance (applicable to the particular net) from at least one void in the electronic circuit design 220. Moreover, the void avoidance engine 110 may identify which segments of the violating nets are located within the threshold distance to the void(s). The void avoidance engine 110 may compile a list of the violating nets determined from the void avoidance verification scan, and output the list through a user interface.

As a particular feature, the void avoidance engine 110 may further process the results of the void avoidance verification scan to determine whether the electronic circuit design 220 includes a double violation. The void avoidance engine 110 may identify a double violation when two (or more) violating nets are positioned within a respective threshold distance from the same particular void and the two violating nets are located on different sides of the same plane (e.g., a first violating net on the top side of a conductive plane and a second violating net on the bottom side of the conductive plane). As such, prior to generation of a double violation alert or other notification, the void avoidance engine 110 may determine from a void avoidance verification scan that a first net and a second net are both within a threshold distance from a particular void and determine that the first net and the second net are on different sides of the same particular plane of the electronic circuit design.

Responsive to a determination of a double violation, the void avoidance engine 110 may generate a double violation alert 230. The double violation alert 230 may be any output indication specifying that two or more nets violate threshold void distance criteria with respect to the same void are located on different sides of the same plane in an electronic circuit design. As examples, the void avoidance engine 110 may generate the double violation alert 230 for presentation through a graphical user interface of an EDA tool, as text presented through a command line interface, or in various other forms. The double violation alert 230 may be distinct (e.g., visually) from other indications of violating nets.

As a specific example, the void avoidance engine 110 may present the double violation alert 230 through a user interface, the double violation alert 230 indicating that both a first net and a second net are within a (respective applicable) threshold distance from the same particular void. Presentation of the double violation alert 230 may include presentation of an indication that the first net and the second net are located on different sides of the same particular plane, e.g., by identifying the particular plane and flagging or otherwise noting the placement of the first net and the second net on different sides of the particular plane. The void avoidance engine 110 may further present the double violation alert 230 by presenting a visual indication specifying a segment of the first net within the threshold distance from the particular void and presenting a visual indication specifying a segment of the second within the threshold distance from the particular void. The visual indications may include highlighting or flagging the violating segments, e.g., in a different color, format, or pattern used to flag segments of other violating nets which are not part of a detected double violation.

Figure 3:
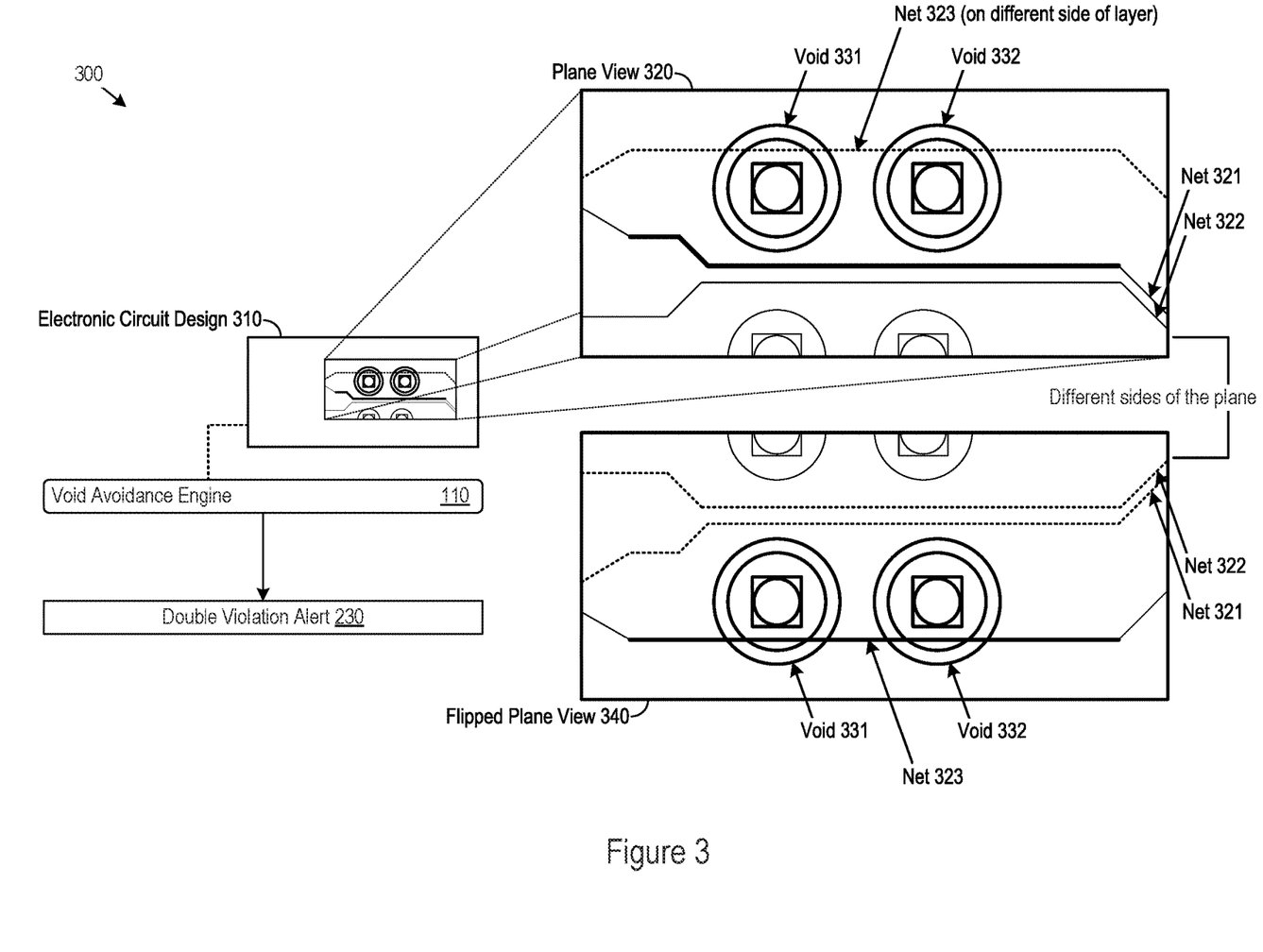
FIG. 3 shows an example scenario in which a void avoidance engine may generate a double violation alert for an electronic circuit design.

FIG. 3 shows an example scenario in which the void avoidance engine 110 may generate a double violation alert for an electronic circuit design. In the example shown in FIG. 3, the void avoidance engine 110 performs a void avoidance verification for an electronic circuit design 310. A portion of the electronic circuit design 310 is shown in FIG. 3 through the plane view 320, which presents a portion of a conductive plane in the electronic circuit design 310. Depicted in the plane view 320 of FIG. 3 are the nets 321 and 322. Also depicted in the plane view 320 is the net 323, which the plane view 320 shows as a dotted line to indicate that the net 323 is located on a different side of the conductive plane. As further seen in the plane view 320, the electronic circuit design 310 includes the voids labeled as the void 331 and the void 332.

Upon execution or triggering of a void avoidance verification scan, the void avoidance engine 110 may determine that the net 321 violates threshold void distance criteria (e.g., a particular threshold distance) applicable to the net 321. In particular, the void avoidance engine 110 may determine that specific segments of the net 321 are positioned within a threshold distance from the voids 331 and 332. In the example shown in FIG. 3, the plane view 320 highlights the violating segments of the net 321 within the threshold distance from the voids 331 and 332, shown in FIG. 3 as thickened black segments of the net 321. As such, the void avoidance engine 110 may identify the net 321 as a violating net.

From the void avoidance verification scan, the void avoidance engine 110 may also identify the net 323 (located on a different side of the conductive plane from the net 321) as a violating net. Such a violation of threshold void distance criteria is shown in FIG. 3 through the flipped plane view 340. The flipped plane view 340 may depict the plane of the electronic circuit design 310 as flipped (e.g., turned over) from the plane view 320. Thus, in the flipped plane view 340, the net 323 is shown as a solid line and the nets 321 and 322 are shown as dotted lines, indicating the nets 321 and 322 are located on a different side of the plane as the net 323.

In the example shown in FIG. 3, the void avoidance engine 110 determines the net 323 as a violating net as the net 323 directly passes through the voids 331 and 332 and is thus located within a threshold distance from the voids 331 and 332. As also shown in FIG. 3, the particular segment of the net 323 that violates the threshold void distance criteria for the net 323 is highlighted as a thickened segment of the net 323.

From the void avoidance verification scan, the void avoidance engine 110 may determine that both the net 321 and the net 323 violate their respective threshold void distance criteria with respect to the void 331 as well as the void 332. The void avoidance engine 110 may further determine that the nets 321 and 323 are located on different sides of the same plane. The void avoidance engine 110 may make such a different-plane-side determination through parameter data for the nets 321 and 323, which may indicate which particular layer or plane of the electronic circuit design 310 respectively that the nets 321 and 323 are positioned on as well which side of the particular plane. In such an example, the void avoidance engine 110 may determine that a double violation has occurred, specifically for the nets 321 and 323 with respect to the voids 331 and 332. Responsive to such a determination, the void avoidance engine 110 may generate the double violation alert 230, which the void avoidance engine 110 may present through the EDA tool, as a script output, or in various other forms.

As described above, the input engine 108 and void avoidance engine 110 may implement various void avoidance verification features that support the identification of violating nets located (at least in part) within applicable threshold distances from voids in an electronic circuit design. The void avoidance engine 110 may further analyze results of a void avoidance verification scan to detect double violations present in the electronic circuit design. In doing so, the void avoidance engine 110 may identify a design characteristics of an electronic circuit design that may impact the functionality and feasibility of a particular circuit design. By specifically detecting double violations, the void avoidance engine 110 may identify a design flaws that could critically impact electronic circuits. High performance circuits may be particularly susceptible to such double violation design flaws, and the void avoidance verification features described herein may support circuit design and manufacture avoiding defects. By supporting such verifications at the design stage (e.g., prior to fabrication or mass production), the features described herein may result in increased process efficiencies, reduced resource consumption, flexible design of electronic circuits, and more. The void avoidance verification features described herein may thus increase overall circuit performance and design effectiveness.

Figure 4:
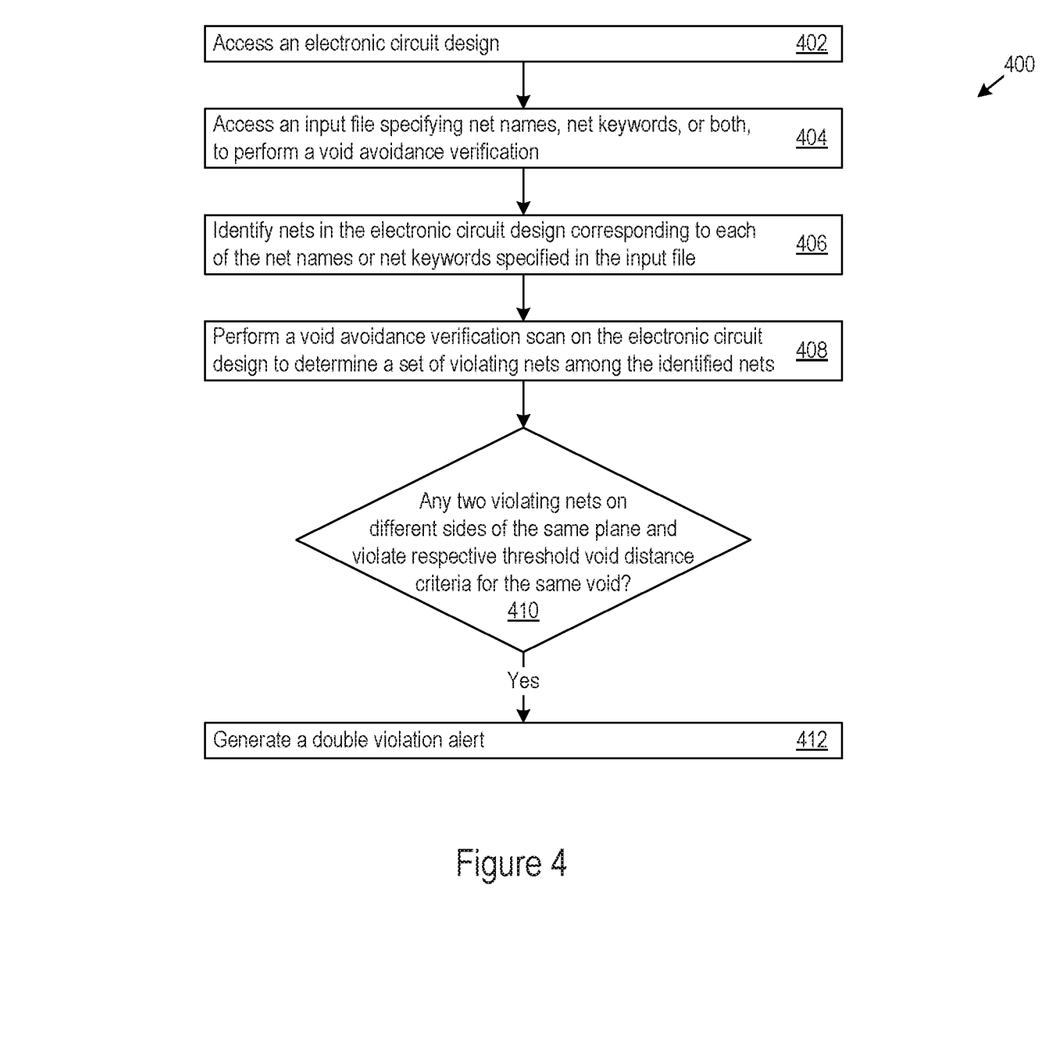
FIG. 4 shows a flow chart of an example method for void avoidance verification.

FIG. 4 shows a flow chart of an example method 400 for void avoidance verification. Execution of the method 400 is described with reference to the input engine 108 and the void avoidance engine 110, though any other device, hardware-programming combination, or other suitable computing system may execute any of the steps of the method 400. As examples, the method 400 may be implemented in the form of executable instructions stored on a machine-readable storage medium or in the form of electronic circuitry.

In implementing or performing the method 400, the input engine 108 may access an electronic circuit design (402). The input engine 108 may do so by identifying a specific electronic circuit design to perform a void avoidance verification upon. For instance, the input engine 108 may identify an electronic circuit design currently open in an EDA tool, a particular electronic circuit design specified in a file path (e.g., input by a user), an electronic circuit design co-located with scripting instructions implemented by the input engine 108, or in any number of other ways.

The input engine 108 may also access an input file specifying net names, net keywords, or both, to perform a void avoidance verification (404). The input file may be user-provided and specify void avoidance verification parameters that govern a void avoidance verification for the electronic circuit design. Thus, the input file may include a list of nets to verify, a respective threshold distance applicable to each of the listed nets, and any other void avoidance verification parameters.

The input engine 108 may parse the input file, for example to identify nets in the electronic circuit design corresponding to each of the net names or net keywords specified in the input file (406). When the input file specifies nets through net names, the input engine 108 may identify the net in the electronic circuit design from a netlist of the electronic circuit design (e.g., via a hash table that provides a listing of nets). When the input file specifies nets through net keywords, the input engine 108 may extract the net names from the electronic circuit design, e.g., via the netlist, and parse the listing of net names to identify the net name(s) that include any of the specified net keywords. From such parsing and extraction, the input engine 108 may identify the specific nets for which the void avoidance verification applies to.

In some examples, the input engine 108 determines the void avoidance verification to be performed on a selected subset of nets in an electronic circuit design. The input file, for example, may identify high-speed data nets in the electronic circuit design for void avoidance verification, but not other nets like a clock signals, low-speed data buses, etc. In that regard, the input engine 108 may flexibly configure which particular nets in the electronic circuit design the void avoidance verification will be performed for, which may increase the flexibility and efficiency of such verifications as opposed to a global verification of all nets in the electronic circuit design.

In implementing or performing the method 400, the void avoidance engine 110 may perform a void avoidance scan on the electronic circuit design to determine a set of violating nets among the identified nets of the input file (408). In some examples, the void avoidance engine 110 may perform the void avoidance verification scan as a series of scans on the electronic circuit design. The void avoidance engine 110 may tailor each void avoidance scan in the series of scans to the particular parameters specific to a particular identified net. For instance, the void avoidance engine 110 may configure each void avoidance scan to apply the specific threshold void distance criteria (e.g., threshold distance) specific to a particular identified net.

Thus, to verify a first net, the void avoidance engine 110 may perform a void avoidance verification scan for the first net, parsing and analyzing the pathing of the first net in the electronic circuit design according to the particular threshold void distance criteria (e.g., threshold distance) applicable to the first net. To verify a second net, the void avoidance engine 110 may perform another void avoidance verification scan, this time applying a different threshold distance specifically applicable to the second net. The void avoidance engine 110 may continue to execute the void avoidance verification scans until each identified net has been verified, and verified using the specific threshold distance applicable to each net. In some examples, the void avoidance engine 110 executes and triggers the scans by generating a series of shell commands supported by an EDA tool to run verification subroutines with the respective parameters applicable to each particular net. As some, but not all, of the nets of an electronic circuit design may be specified in the input file, the void avoidance engine 110 may trigger void avoidance verification scans for the specified nets, but not the other nets.

From the void avoidance verification scan, the void avoidance engine 110 may determine a set of violating nets from the identified nets. The violating nets may be output as a violating nets list, for example indicating the location (e.g., coordinates) of violating segments, the particular voids that violating nets are within a threshold distance from, which plane and side such violations occur, or more. The void avoidance engine 110 may further detect whether a double violation is present in the electronic circuit design. To do so, the void avoidance engine 110 may identify whether any two violating nets are located on different sides of the same conductive plane and violate respective threshold void distance criteria with respect to the same void (410). If so, the void avoidance engine 110 may detect a double violation and generate a double violation alert (412). If not, the void avoidance engine 110 may determine that no double violation is present, and forego generation of the double violation alert.

Although one example was shown in FIG. 4, the steps of the method 400 may be ordered in various ways. Likewise, the method 400 may include any number of additional or alternative steps, including steps implementing any feature described herein with respect to the input engine 108, the void avoidance engine 110, or a combination thereof.

Figure 5:
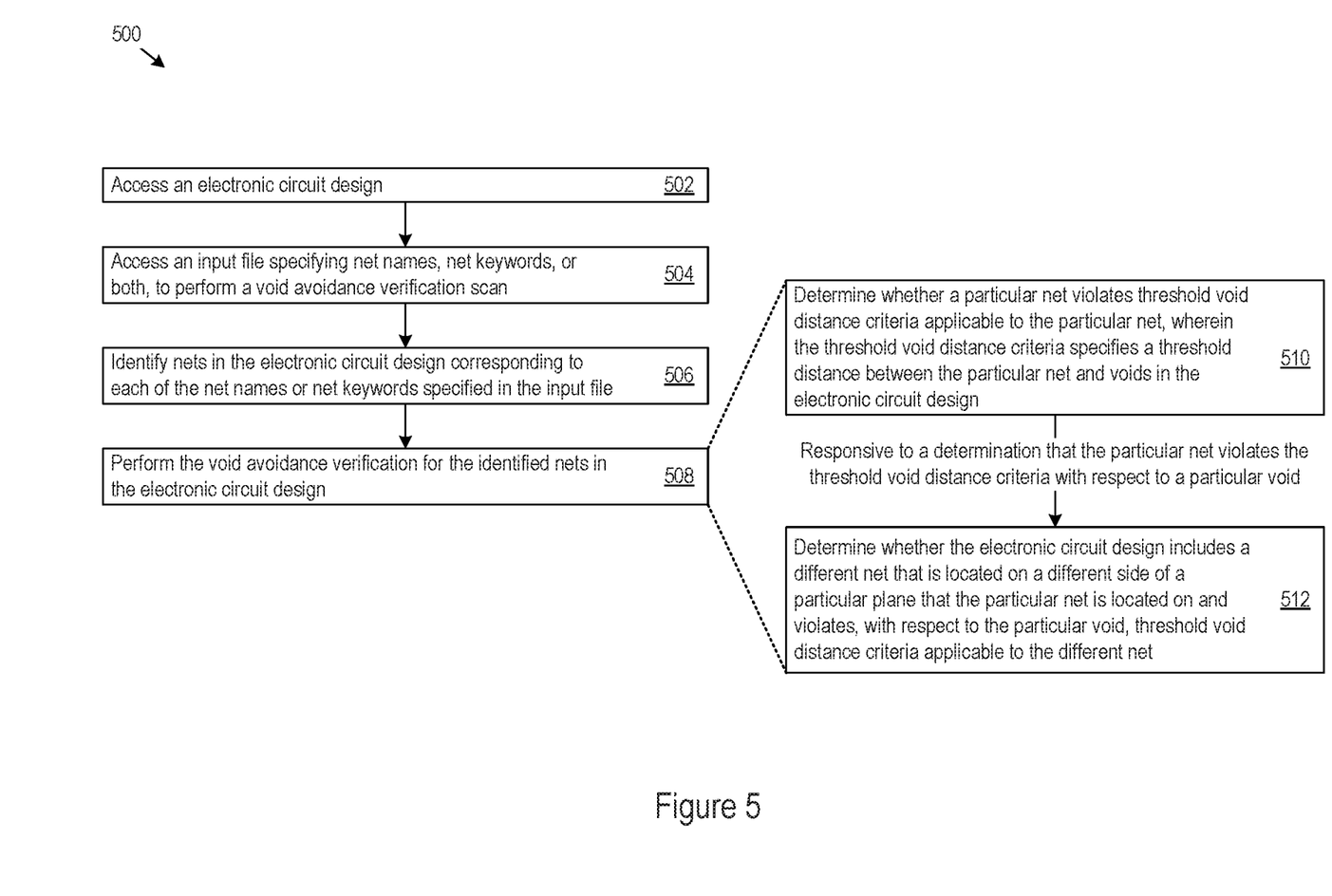
FIG. 5 shows a flow chart of another example method for void avoidance verification.

FIG. 5 shows a flow chart of an example method 500 for void avoidance verification. As with the method 400 shown as an example FIG. 4, execution of the method 500 is also described with reference to the input engine 108 and the void avoidance engine 110. However, any other device, hardware-programming combination, or other suitable computing system may execute any of the steps of the method 500. As examples, the method 500 may be implemented in the form of executable instructions stored on a machine-readable storage medium or in the form of electronic circuitry.

In implementing or performing the method 500, the input engine 108 may access an electronic circuit design (502) and access an input file specifying net names, net keywords, or both, to perform a void avoidance verification (504). The input engine 108 may also identify nets in the electronic circuit design corresponding to each of the net names or net keywords in specified in the input file (506). In that regard, the input engine 108 may identify various void avoidance verification parameters.

In implementing or performing the method 500, the void avoidance engine 110 may perform the void avoidance verification according to the void avoidance verification parameters. In particular, the void avoidance engine 110 may perform the void avoidance verification for the identified nets in the electronic circuit design (508). In doing so, the void avoidance engine 110 may, for each particular net identified from the input file, determine whether the particular net violates threshold void distance criteria applicable to the particular net, wherein the threshold void distance criteria specifies a threshold distance between the particular net and voids in the electronic circuit design (510). Responsive to a determination that the particular net violates the threshold void distance criteria with respect to a particular void in the electronic circuit design, the void avoidance engine 110 may determine whether the electronic circuit design includes a different net that is located on a different side of a particular (e.g., conductive) plane that the particular net is located on and violates, with respect to the particular void, threshold void distance criteria applicable to the different net (512). The void avoidance engine 110 may thus detect a double violation present in the electronic circuit design, for instance doing so by identifying the different net from a list of violating nets identified through void avoidance verification scans.

In some examples, the input engine 108 extracts specific void avoidance verification parameters applicable to different nets in the electronic circuit design from the input file. The input engine 108 may access, from the input file or a user interface, the threshold void distance criteria applicable to the particular net as well as the threshold void distance criteria applicable to the different net. The threshold void distance criteria applicable to the particular net may specify a threshold distance that is different from a threshold distance specified in the threshold void distance criteria applicable to the different net, though in other examples the respective threshold void distance criteria may apply a common threshold distance.

In some implementations, the void avoidance engine 110 may generate a double violation alert responsive to a determination that the electronic circuit design includes the different net that is located on a different side of the particular plane that the particular net is located on and violates the threshold void distance criteria applicable to the different net with respect to the same particular void. In such examples, the void avoidance engine 110 may present the double violation alert, e.g., via a user interface, to indicate violations to the threshold void distance criteria by the particular net and the different net with respect to the particular void. The void avoidance engine 110 may, for instance, present an indication that the particular net and the different net are located on different sides of the same particular plane. Example indications may include flagging or highlighting violating segments of the particular net or the different net in a distinct color or pattern from other violating nets that are not part of a double violation, flagging the particular net or different net in a list of violating nets, or various in other ways.

As other presentation examples, the void avoidance engine 110 may present a visual indication specifying a segment of the particular net that is within the threshold distance to the particular void and do so responsive to a determination that the particular net violates the threshold void distance criteria. The visual indication may include a highlighting or flagging of the segments of the particular net that violate the threshold void distance criteria.

Although one example was shown in FIG. 5, the steps of the method 500 may be ordered in various ways. Likewise, the method 500 may include any number of additional or alternative steps, including steps implementing any feature described herein with respect to the input engine 108, the void avoidance engine 110, or a combination thereof.

Figure 6:
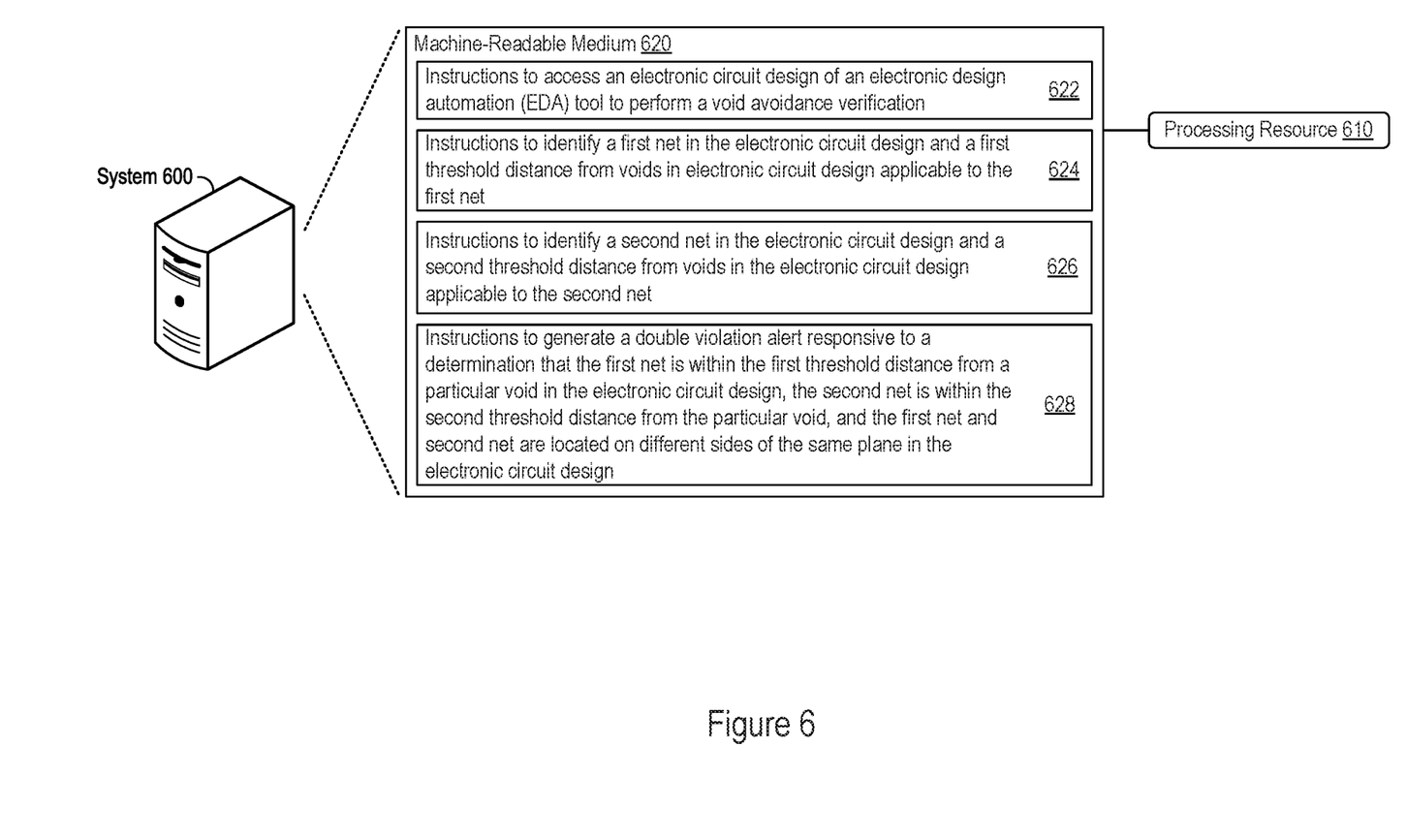
FIG. 6 shows an example system that supports void avoidance verification.

FIG. 6 shows an example of a system 600 that supports void avoidance verifications for an electronic circuit design. The system 600 may include a processing resource 610, which may take the form of a single or multiple processors. The processor(s) may include a central processing unit (CPU), microprocessor, or any hardware device suitable for executing instructions stored on a machine-readable medium, such as the machine-readable medium 620 shown in FIG. 6. The machine-readable medium 620 may be any non-transitory electronic, magnetic, optical, or other physical storage device that stores executable instructions, such as the instructions 622, 624, 626, and 628 shown in FIG. 6. As such, the machine-readable medium 620 may be, for example, Random Access Memory (RAM) such as dynamic RAM (DRAM), flash memory, memristor memory, spin-transfer torque memory, an Electrically-Erasable Programmable Read-Only Memory (EEPROM), a storage drive, an optical disk, and the like.

The system 600 may execute instructions stored on the machine-readable medium 620 through the processing resource 610. Executing the instructions may cause the system 600 to perform any of the features described herein, including according to any features of the input engine 108, the void avoidance engine 110, or a combination thereof.

For example, execution of the instructions 622, 624, 626, and 628 by the processing resource 610 may cause the system 600 to access an electronic circuit design of an EDA tool to perform a void avoidance verification (instructions 622); identify a first net in the electronic circuit design and a first threshold distance from voids in electronic circuit design applicable to the first net (instructions 624); identify a second net in the electronic circuit design and a second threshold distance from voids in the electronic circuit design applicable to the second net (instructions 626); and generate a double violation alert responsive to a determination that (i) the first net is within the first threshold distance from a particular void in the electronic circuit design; (ii) the second net is within the second threshold distance from the particular void; and (iii) the first net and second net are located on different sides of the same plane in the electronic circuit design (instructions 628).

In some examples, the machine-readable medium 620 may include instructions executable by the processing resource 610 to identify the first net, the first threshold distance, the second net, and the second threshold distance according to user input. Example user inputs include inputs received through a command line interface, graphical user interface, input files specifying any number of void avoidance verification parameters, and more. As another example, the machine-readable medium 620 may include instructions further executable by the processing resource 610 to present the double violation alert through a user interface, including presenting an indication that the first net and the second net are located on different sides of the same plane of the electronic circuit design. The double violation alert may visually identify the first net, the second net, the particular void, or any combination thereof.

The systems, methods, devices, engines, and logic described above, including the input engine 108 and the void avoidance engine 110, may be implemented in many different ways in many different combinations of hardware, logic, circuitry, and executable instructions stored on a machine-readable medium. For example, the input engine 108, the void avoidance engine 110, or both, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine readable instructions stored on the medium, which when executed in an endpoint, computer system, or other device, cause the device to perform operations according to any of the description above, including according to any features of the input engine 108, void avoidance engine 110, or both.

The processing capability of the systems, devices, and engines described herein, including the input engine 108 and the void avoidance engine 110, may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A system comprising:
an input engine comprising hardware and programming to:
access an electronic circuit design of an electronic design automation (EDA) tool; and
identify a first net and a second net in an electronic circuit design; and
a void avoidance engine to:
perform a void avoidance verification scan to determine whether the first net, the second net, or both, are within a threshold distance from any voids in the electronic circuit design; and
generate a double violation alert responsive to a determination that the first net and the second net are both within the threshold distance from a particular void in the electronic circuit design and that the first net and the second net are located on different sides of a same particular plane of the electronic circuit design.

2. The system of claim 1, wherein the void avoidance engine is further to, prior to generation of the double violation alert:
determine, from the void avoidance verification scan, that the first net and the second net are both within the threshold distance from the particular void; and
determine that the first net and the second net are on different sides of the same particular plane.

3. The system of claim 1, wherein the input engine is identify the first net and the second net based on net names, net keywords, or both, specified in a user-provided input file.

4. The system of claim 1, wherein the input engine is further to identify the threshold distance applicable to the first net and the second net from a user-provided input file.

5. The system of claim 1, wherein the void avoidance engine is further to present the double violation alert through a user interface, the double violation alert indicating that both the first net and the second net are within the threshold distance from the same particular void.

6. The system of claim 5, wherein the void avoidance engine is further to present the double violation alert by presenting an indication that the first net and the second net are located on different sides of the same particular plane.

7. The system of claim 5, wherein the void avoidance engine is further to present the double violation alert by:
presenting a visual indication specifying a segment of the first net within the threshold distance from the particular void; and
presenting a visual indication specifying a segment of the second net within the threshold distance from the particular void.

8. A method comprising:
accessing an electronic circuit design of an electronic design automation (EDA) tool with a processing resource;

accessing an input file specifying net names, net keywords, or both, with the processing resource to perform a void avoidance verification;

identifying nets in the electronic circuit design with the processing resource corresponding to each of the net names or net keywords specified in the input file;

performing the void avoidance verification for the identified nets in the electronic circuit design by, for each particular net:

determining with the processing resource whether the particular net violates threshold void distance criteria applicable to the particular net, wherein the threshold void distance criteria specifies a threshold distance between the particular net and voids in the electronic circuit design; and responsive to a determination that the particular net violates the threshold void distance criteria with respect to a particular void in the electronic circuit design:

determining with the processing resource whether the electronic circuit design includes a different net that is:

located on a different side of a particular plane that the particular net is located on; and violates, with respect to the particular void, threshold void distance criteria applicable to the different net.

9. The method of claim 8, further comprising accessing, from the input file or a user interface:

the threshold void distance criteria applicable to the particular net; and the threshold void distance criteria applicable to the different net.

10. The method of claim 8, wherein the threshold void distance criteria applicable to the particular net specifies a threshold distance that is different from a threshold distance specified in the threshold void distance criteria applicable to the different net.

11. The method of claim 8, further comprising generating a double violation alert responsive to a determination that the electronic circuit design includes the different net that is located on a different side of the particular plane that the particular net is located on and violates the threshold void distance criteria applicable to the different net with respect to the same particular void.

12. The method of claim 11, further comprising presenting the double violation alert to indicate violations to the threshold void distance criteria by the particular net and the different net with respect to the particular void.

13. The method of claim 12, wherein presenting the double violation alert comprises presenting an indication that the particular net and the different net are located on different sides of the same particular plane.

14. The method of claim 8, further comprising, responsive to a determination that the particular net violates the threshold void distance criteria:

presenting a visual indication specifying a segment of the particular net that is within the threshold distance to the particular void.

15. A non-transitory machine-readable medium comprising instructions executable by a processing resource to:

access an electronic circuit design of an electronic design automation (EDA) tool to perform a void avoidance verification;

identify a first net in the electronic circuit design and a first threshold distance from voids in electronic circuit design applicable to the first net;

identify a second net in the electronic circuit design and a second threshold distance from voids in the electronic circuit design applicable to the second net; and generate a double violation alert responsive to a determination that:

the first net is within the first threshold distance from a particular void in the electronic circuit design;

the second net is within the second threshold distance from the particular void; and the first net and second net are located on different sides of the same plane in the electronic circuit design.

16. The non-transitory machine-readable medium of claim 15, wherein the instructions are executable by the processing resource to identify the first net, the first threshold distance, the second net, and the second threshold distance according to user input.

17. The non-transitory machine-readable medium of claim 15, wherein the first threshold distance is different from the second threshold distance.

18. The non-transitory machine-readable medium of claim 15, wherein the instructions are executable by the processing resource to determine that the first net is within the first threshold distance from the particular void or that the second net is within the second threshold distance from the particular void through execution of a void avoidance verification scan.

19. The non-transitory machine-readable medium of claim 15, wherein the instructions are further executable by the processing resource to present the double violation alert through a user interface, including presenting an indication that the first net and the second net are located on different sides of the same plane of the electronic circuit design.

20. The non-transitory machine-readable medium of claim 19, wherein the double violation alert visually identifies the first net, the second net, the particular void, or any combination thereof.

* * * * *